(12) United States Patent
Gaggl et al.

(10) Patent No.: US 7,339,415 B2
(45) Date of Patent: Mar. 4, 2008

(54) SC CIRCUIT ARRANGEMENT

(75) Inventors: Richard Gaggl, Villach (AT); Joerg Hauptmann, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/009,538

(22) Filed: Dec. 10, 2004

(65) Prior Publication Data

US 2005/0156654 A1 Jul. 21, 2005

(30) Foreign Application Priority Data

Dec. 10, 2003 (DE) ................. 103 57 785

(51) Int. Cl.
*H03K 3/01* (2006.01)
*G05F 1/10* (2006.01)
(52) U.S. Cl. ..................... 327/537; 327/534
(58) Field of Classification Search ........ 327/534–537, 327/390, 589
See application file for complete search history.

(56) References Cited

U.S. PATENT DOCUMENTS

| | | | | |
|---|---|---|---|---|
| 4,716,319 A | * | 12/1987 | Rebeschini | ................. 327/554 |
| 5,541,531 A | * | 7/1996 | Kultgen | ........................ 326/62 |
| 5,945,872 A | | 8/1999 | Robertson et al. | |
| 6,060,937 A | | 5/2000 | Singer et al. | |
| 6,118,326 A | | 9/2000 | Singer et al. | |
| 6,424,208 B1 | * | 7/2002 | Pinai | .......................... 327/554 |
| 6,486,821 B1 | | 11/2002 | Aude et al. | |
| 6,538,491 B1 | * | 3/2003 | Spanoche | ................... 327/337 |
| 6,636,083 B1 | | 10/2003 | Wong et al. | |
| 6,731,155 B2 | * | 5/2004 | Hakkarainen et al. | ...... 327/390 |
| 6,967,523 B2 | * | 11/2005 | DeMone | ..................... 327/537 |
| 6,977,523 B2 | * | 12/2005 | Tamaki | ........................ 326/68 |

FOREIGN PATENT DOCUMENTS

CN 2508464 Y 8/2002

OTHER PUBLICATIONS

Yung et al., "Process Dependency of MOSFET Depletion Mode MOS Capacitors in Series Compensation", Proceedings of the 45$^{th}$ Midwest Symposium on Circuits and Systems, Aug. 2002, pp. I-263 to I-266, (4 pages).
Tietze et al., "Halbleiter-Schaltungstechnik", 12. Auflage, Berlin[u.a.]: Springer-Verlag, 2002, pp. 866-871, (6 pages).

* cited by examiner

*Primary Examiner*—Dinh T. Le
(74) *Attorney, Agent, or Firm*—Maginot, Moore & Beck

(57) ABSTRACT

The invention relates to a linear SC circuit arrangement using integrated deep submicron technology, having at least one switched capacitor circuit which is connected to an input for inputting an input signal and which has at least one switchable capacitor and at least one first transistor, having a control circuit for directly actuating the first transistors, having an output stage which has second transistors and which is arranged downstream of the switched capacitor circuit, where the first transistors are in the form of thick oxide transistors and have a higher withstand voltage than the second transistors.

17 Claims, 3 Drawing Sheets

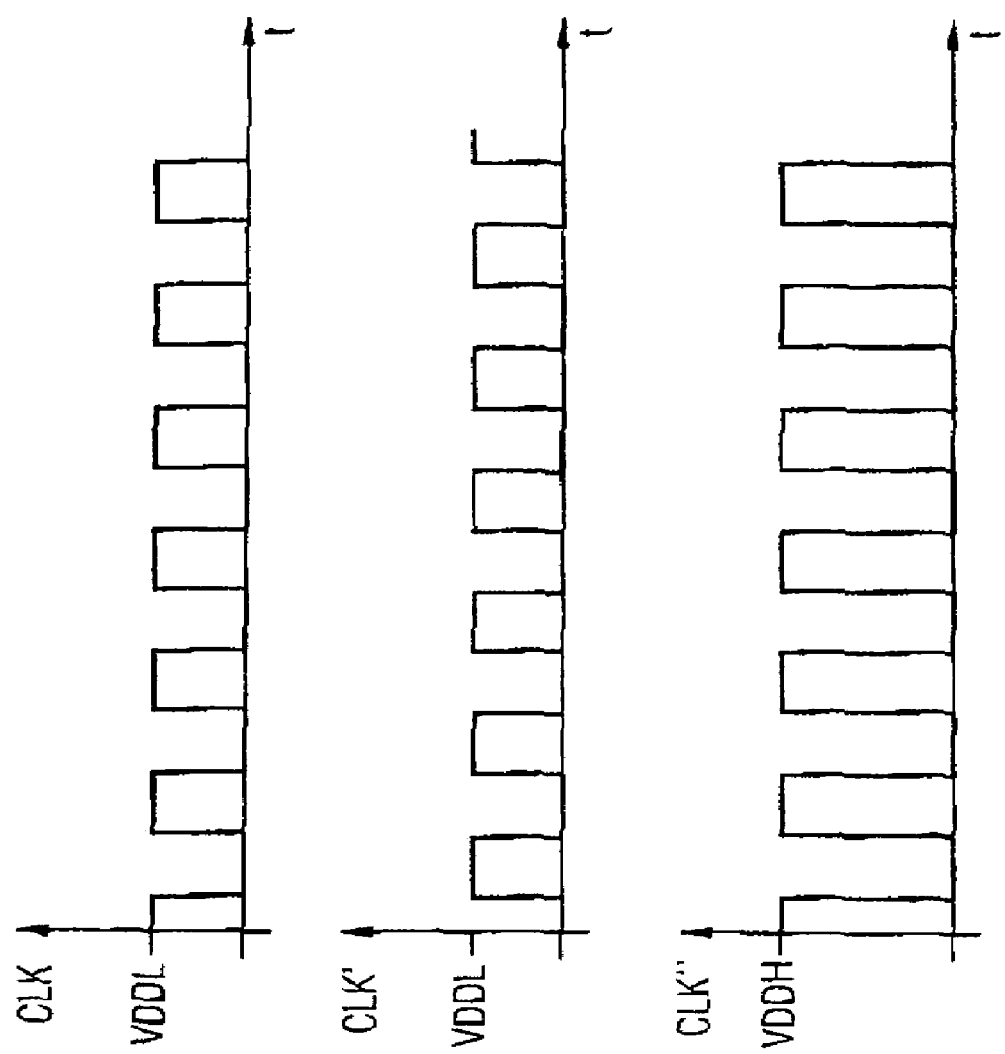

SC CIRCUIT ARRANGEMENT

BACKGROUND

The invention relates to the field of linear SC circuit arrangements. In particular, the invention relates to linear SC circuit arrangements using integrated deep submicron technology which has at least one switched capacitor circuit, a control circuit and an output stage which is connected downstream of the switched capacitor circuit.

In the text below, an SC circuit arrangement is to be understood to mean a circuit which has at least one switched capacitor. Such switched capacitors, which are usually also referred to as "switched capacitor" circuits or SC circuits, are known generally in a multiplicity of embodiments and applications. Applications with such switched capacitors can be found, by way of example, in switched capacitor filters (see U. Tietze, Ch. Schenk, Halbleiterschaltungstechnik *Seimeonductor Circuitry*, 12th edition, page 866-871), SC subtractors and the like.

Switched capacitor circuits are provided in order to simulate the characteristic of a resistor in the best possible manner. This is possible only if the controllable switches or transistors have a turn-on resistance Ron which is as linear as possible. However, this can be ensured only if these controlled switches are operated in the linear range of their characteristic curve. The problem with this, however, is that reducing the actuation potential means that the corresponding transistors are simply no longer operated in ideal fashion in the linear range of their characteristic curve, a direct result of which is also a nonlinear turn-on resistance Ron.

The switched capacitances can be used to provide a filter whose filter parameter is independent of the absolute capacitance value; in particular, the cut-off frequency may in this case be set variably over a wider range. In addition, the resonant frequency, the quality factor and the gain at the resonant frequency may also be set independently of one another. In order to achieve the same functionality with conventional filters, it would be necessary to provide a universal filter, at least of second order, having filter coefficients which can be set independently of one another. However, the advantage of an SC filter over a universal filter of this type is the opportunity of simpler implementation. SC filters are used, in particular, in telecommunications, for example in transceiver circuits, broadband applications and linecard applications.

As in the case of most integrated circuits, such applications also have the increasing need to provide an ever greater level of integration and, related to this, ever smaller feature sizes for future integrated circuits. Current and future generations of large scale integrated circuits therefore use "deep submicron" technology. Deep submicron technology denotes semiconductor technologies where the corresponding integrated circuits are produced with a minimum feature size of no more than 0.25 µm, particularly no more than 0.2 µm. In semiconductor technologies used to date, where feature sizes of greater than 0.25 µm have thus been used, the supply voltage for supplying the integrated circuit was still sufficiently high to actuate the corresponding control connections of the controllable switches with a control signal which was such that the linearity demands of these switches were still met.

In integrated circuits produced using deep submicron technologies, however, a much lower supply voltage of, by way of example, less than 2 volts is used. The problem with this is now that such low supply voltages mean that the actuation potentials for actuating the control connections of the controlled switches are also not high enough to provide a sufficiently linear characteristic curve for the controlled switch. Linear switches are an absolute necessity, besides linear capacitances, for implementing linear switched capacitor circuits, however.

For this reason, the controlled switches are linearized by providing switched capacitor circuits produced using deep submicron technologies with a precharging circuit which is used to precharge the control connections of the controlled circuit. This method is also referred to as a "boot strapping" method and is described, by way of example, in U.S. Pat. No. 6,118,326, U.S. Pat. No. 5,945,872 and U.S. Pat. No. 6,060,937. Here, a voltage store is first precharged and is then clamped between the input connection of the SC circuit and the control electrode of the controlled switch which is provided for switching the switchable capacitance. This adds the control voltage precharged in the voltage store to the input signal.

The problem with this method, however, is that the signal source for the input signal is loaded to a peak during the controlled switch's changeover operation. This signal source, which is in the form of an operational amplifier or in the form of an output stage, for example, now needs to be much more powerful in order to provide the requisite, peak current for the changeover operation or to drive the controlled switches and to charge the capacitances. This equally means an increase in the power loss, which is to be avoided, however, particularly in applications with a local power supply.

The fact that the signal source briefly needs to provide a very large current means that it needs to be oversized accordingly, a direct result of which is also a larger area involvement for the integrated circuit.

Another problem is that the well substrate diodes in the integrated controllable switch, which are subjected to brief but relatively large voltage spikes during the changeover operation, experience additional loading which can result in these elements being damaged or failing. To prevent this, the well substrate diode also needs to be made more robust. This results in reliability problems for the controllable switch from time to time, however.

The document Yung, W. et al., Process Dependency of MOSFET Depletion Mode MOS Capacitors in Series Compensation, Proc. 45th Midwest Symposium on Circuits and Systems, Aug. 2002, No 1, pages I-263 to I-266, describes a switched capacitor integrator and a second-order SC/low-pass filter. This switched capacitor integrator and the second-order SC/low-pass filter can be produced in various CMOS production processes, namely in 0.35 µm, 0.25 µm and 0.15 µm (deep submicron), and can be compared with one another. However, this document gives no indication at all of the transistors in the switched capacitor circuit being in the form of thick oxide transistors.

U.S. patent specification U.S. Pat. No. 6,636,083 B1 describes a self-adjusting current source for low-power SC circuits. The self-adjusting current source is used to reduce the transistors' leakage current which arises with deep submicron processors.

The present invention is now based on the object of providing an SC circuit arrangement of the type mentioned in the introduction which permits more efficient and, in particular, more robust implementation of linear switched capacitor circuits.

SUMMARY

Accordingly, a linear SC circuit arrangement using integrated deep submicron technology is provided, having at least one switched capacitor circuit which is connected to an input for inputting an input signal and which has at least one switchable capacitor and at least one first transistor, having a control circuit for directly actuating the first transistors, having an output stage which has second transistors and which is arranged downstream of the switched capacitor circuit, where the first transistors are in the form of thick oxide transistors and have a higher withstand voltage than the second transistors.

The insight on which the present invention is based is that not all transistors in an integrated circuit produced using deep submicron technology are in the form of "thin oxide transistors" with a low control voltage. Rather, such integrated circuits also optionally contain transistor types which are equipped with a thicker gate oxide. Such controlled switches, which are subsequently also referred to as thick oxide transistors, are typically used for the digital input/output connections (I/O interface, pads) in integrated circuits produced using deep submicron technologies. Such input/output connections require transistors having a relatively high withstand voltage. Said thick oxide transistors advantageously have a higher withstand voltage of, by way of example, greater than 3 volts than conventional transistors produced using deep submicron technology.

The idea on which the present invention is based involves such thick oxide transistors now also being used for implementing the controlled switches in the switched capacitor circuit. The core of the present invention is thus to combine the thick oxide transistors and the transistors produced using deep submicron technology for efficient and robust implementation of modern linear switched capacitor circuits. This combination allows the advantages for both transistor types to be used.

The fact that the signal source does not now need to be furnished with relatively high power in order to provide the peak currents demanded also results in a reduction in the current drawn and in a smaller chip area for the overall circuit arrangement.

The use of thick oxide transistors for at least some controlled switches in the switched capacitor circuit actuates their control electrodes using the desired, constantly high control potentials. It is therefore possible to dispense with a precharging circuit (boot strapping circuit) provided specifically for the purpose, since there are now no peak currents for charging an upstream voltage store and for reversing the charge on this voltage store. This also reduces the load on the signal source. The relatively high withstand voltage means that a high level of product reliability for such a switched capacitor arrangement is assured. The combination of thick oxide transistors for such switches, which have to switch a higher power in a shorter time, with the transistors using deep submicron technology for the remaining circuit parts also permits efficient implementation of switched capacitor circuit arrangements using modern deep submicron technologies too.

In one refinement of the invention, the dielectric or the gate oxide of the thick oxide transistors (first transistors) is significantly larger than the dielectric of the transistors produced using deep submicron technology. Typically, the gate oxide of the thick oxide transistors has at least 1.5 times the thickness, particularly twice the thickness, of the gate oxide of the other transistors (thin oxide transistors).

In one refinement, the input and a first electrode on a switchable capacitor, on the one hand, and the second electrode of the switchable capacitor and the output stage, on the other hand, respectively have a first transistor arranged between them. These transistors can each be actuated by a clock signal and a clock signal which is clocked in antiphase thereto. To actuate the controllable switches, a control circuit is provided which is advantageously in the form of a clock generator. The output of this clock generator generates the clock signal and the clock signal clocked in antiphase thereto, the antiphase clock signals not being allowed to overlap.

In one particularly advantageous development, a first portion of the first transistors is actuated by the clock signal, and a second portion of the first transistors is cross actuated by the clock signal which is complementary thereto. However, there must not necessarily be a clock signal and a clock signal which is in antiphase thereto. It would also be conceivable for the edges of the two clock signals to overlap slightly, so that a significantly more dynamic switching operation for the controlled switches can be produced, which is of particular advantage particularly in radio-frequency applications today.

In one refinement, the first transistors have the same semiconductor topology as third transistors which are provided for a digitally designed I/O interface on the SC circuit arrangement.

In one particularly advantageous development, only the transistor arranged between the input and a first electrode on a switchable capacitor is in the form of a first transistor. The remaining transistors in the switched capacitor circuit have fourth transistors which have a lower withstand voltage than the first transistors. These fourth transistors have the same withstand voltage as the second transistors, in particular.

In one particularly advantageous development, the control device produces a first control signal with a low signal level for actuating the fourth transistors. To actuate the first transistor, the control device has a charging device, particularly a charge pump, which converts the first control signal into a second control signal, which has a higher signal level than the first control signal.

In one refinement, the switched capacitor circuit is in the form of a switched capacitor filter.

In a typical refinement, the transistors in the switched capacitor circuit are in the form of MOS transistors, particularly in the form of CMOS transistors.

As already mentioned at the outset, deep submicron technologies are referred to as such today when their feature size is in the range of less than 0.25 µm or in some cases also of less than 0.2 µm. However, the invention is particularly suitable for technologies with feature sizes of less than 0.18 µm or of less than 0.13 µm. The invention is particularly advantageous for future technologies in the range between approximately 0.09 µm and 0.07 µm, since in this case it is no longer actually possible, given the demanded linearity requirements, to ensure actuation of the corresponding switched capacitor transistors in another way, or it is possible only with a considerably greater level of circuit complexity. It is therefore generally true that the advantages of the invention become ever greater as the feature size becomes ever smaller.

BRIEF DESCRIPTION OF THE DRAWINGS

The invention is described below with reference to the exemplary embodiments indicated in the figures of the drawing, in which:

FIG. 3 shows signal/time diagrams to illustrate the various clock signals in the circuit in FIG. 3.

In the figures of the drawing, elements and signals which are the same or have the same function have been provided with the same reference symbols—unless stated otherwise.

DESCRIPTION

Figure 1:
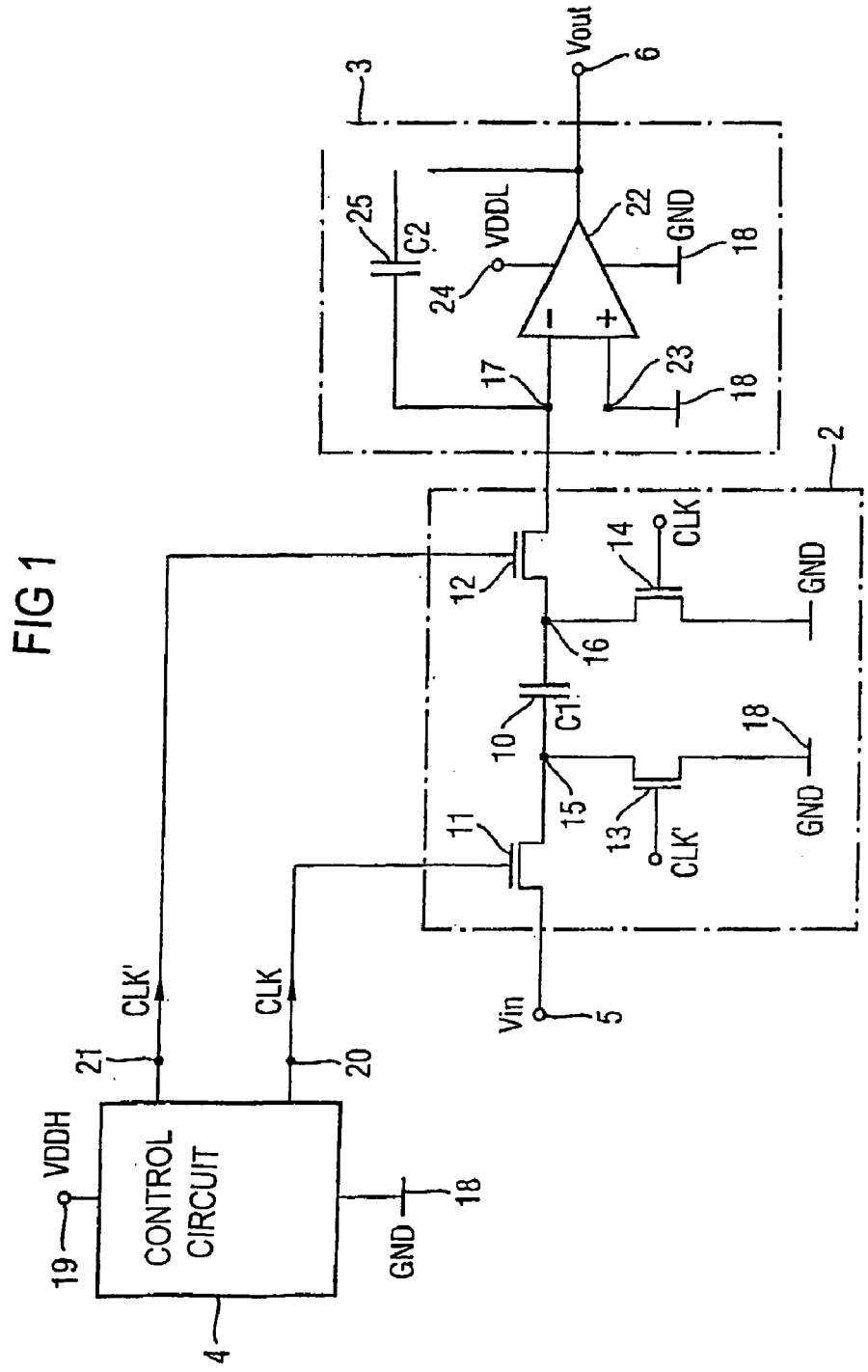
FIG. 1 shows a block diagram of a first exemplary embodiment of an SC circuit arrangement based on the invention.

FIG. 1 shows a block diagram of a first exemplary embodiment of an SC circuit arrangement based on the invention.

In FIG. 1, the SC circuit arrangement is provided with reference symbol 1. The SC circuit arrangement 1 has a switched capacitor circuit 2 and an output stage 3 connected downstream of this circuit 2. To control the switched capacitor circuit 2, a control circuit 4 is provided. The SC circuit arrangement also has an input 5, into which an input signal Vin can be input, and an output 6, from which it is possible to pick off an output signal Vout.

The switched capacitor circuit 2 has a capacitive element 10, for example a capacitor. This capacitor 10 is designed to able to be switched using a plurality of controllable switches 11-14. In the present exemplary embodiment, four controllable switches 11-14 are provided which, by way of example, may be in the form of transistors, for example MOSFETs, JFETs, bipolar transistors etc. A first transistor 11, which is in the form of an input transistor, is arranged with its load path between the input 5 and a first electrode 15 on the capacitor 10. A second transistor 12, which is in the form of an output transistor, is arranged with its load path between the second electrode 16 of the capacitor 10 and a first input connection 17 on the downstream output stage 3. The two other transistors 13, 14 in the switched capacitor circuit 2 are connected by means of their load paths to a respective one of the electrodes 15, 16 and a first supply connection 18.

To control the transistors 11-14, a control circuit 4 is provided. The control circuit 4 is arranged between the first supply connection 18 and a second supply connection 19. In the present exemplary embodiment, the first supply connection 18 is at a first supply potential GND, for example a reference potential or the potential of the reference ground, while the second supply connection 19 is at a second supply potential VDDH, for example a positive supply potential VDDH.

In the present exemplary embodiment, the control circuit 4 is in the form of a clock generator which provides a first clock signal CLK at a first output 20 and a clock signal CLK' which is complementary (in antiphase) thereto at a second output 21. These clock signals CLK, CLK' are used to actuate the transistors 11-14. In the present exemplary embodiment, the transistors 11, 14 are respectively actuated by the clock signal CLK and the transistors 12, 13 are respectively actuated by the clock signal CLK'.

In the present exemplary embodiment, the output stage 3 has an amplifier 22 which, by way of example, is in the form of an operational amplifier or is in the form of a push-pull output stage. In this arrangement, the first input 17 forms the inverting input of the amplifier 22 into which the current signal I1 produced at the output of the switched capacitor circuit 2 is input. The second input 23 of the amplifier 22 is connected to the first supply connection 18. The supply side of the amplifier 22 is arranged between the first supply connection 18 and a third supply connection 24. The third supply connection 24 has a third supply potential VDDL, for example a positive supply potential VDDL. In addition, an integrated coupling capacitance 25 is arranged between the input 17 and the output 6.

The SC circuit arrangement 1 is thus in the form of a filter with a switched capacitance 10. In this case, the capacitor 10 is charged and discharged in step with the switching frequency f of the clock signals CLK, CLK'. The mean integration current I1 is proportional to this switching frequency f. In this context, the integration time constant T can be controlled using the switching frequency f in line with the following relationship:

$$T = C2/(f*C1)$$

If such integrators are used to construct a universal filter, then the frequencies f can be used to control and alter both the cut-off frequency and the filter characteristic.

The SC circuit arrangement 1 is designed using "deep submicron" technology. In line with the invention, the transistors 11-14 in the switched capacitor circuit 2 are now in the form of "thick oxide transistors". These thick oxide transistors 11-14 are actuated using a higher control potential than is required for the transistors (not shown in FIG. 1) in the output stage 3 or in the other circuit elements in the SC circuit arrangement 1. For this reason, the second supply potential VDDH, which is used to supply the control circuit 4 and hence to produce the clock signals CLK, CLK', is higher than the third supply potential VDDL, which is used to supply the other circuit parts. The following is thus true:

$$VDDH > VDDL$$

In the present exemplary embodiment, it may be assumed that the third supply potential VDDL is lower than 2 volts (for example 1.5 volts or 1.8 volts). This low supply potential VDDL corresponds to the supply potential which is required in order to operate and to supply the transistors produced using deep submicron technology. By contrast, the second supply potential VDDH is higher than 3 volts, for example 3.3 volts or 5 volts. This high supply potential VDDH corresponds to the supply potential which is required in order to operate and to supply the thick oxide transistors or the transistors in the I/O interface.

In line with the invention, the control circuit 4 is now designed to provide clock signals CLK, CLK' which can be used to actuate the thick oxide transistors 11-14 in appropriate fashion, so that the overall switched capacitor circuit 2 meets the linearity requirements. The amplitude of the clock signals CLK, CLK' produced by the control circuit 4 thus corresponds approximately to the amplitude of the second supply potential VDDH. By contrast, the other circuit parts and elements in the SC circuit arrangement 1 do not require such high control potentials CLK, CLK', which means that these are supplied with the lower supply potential VDDL.

Figure 2:
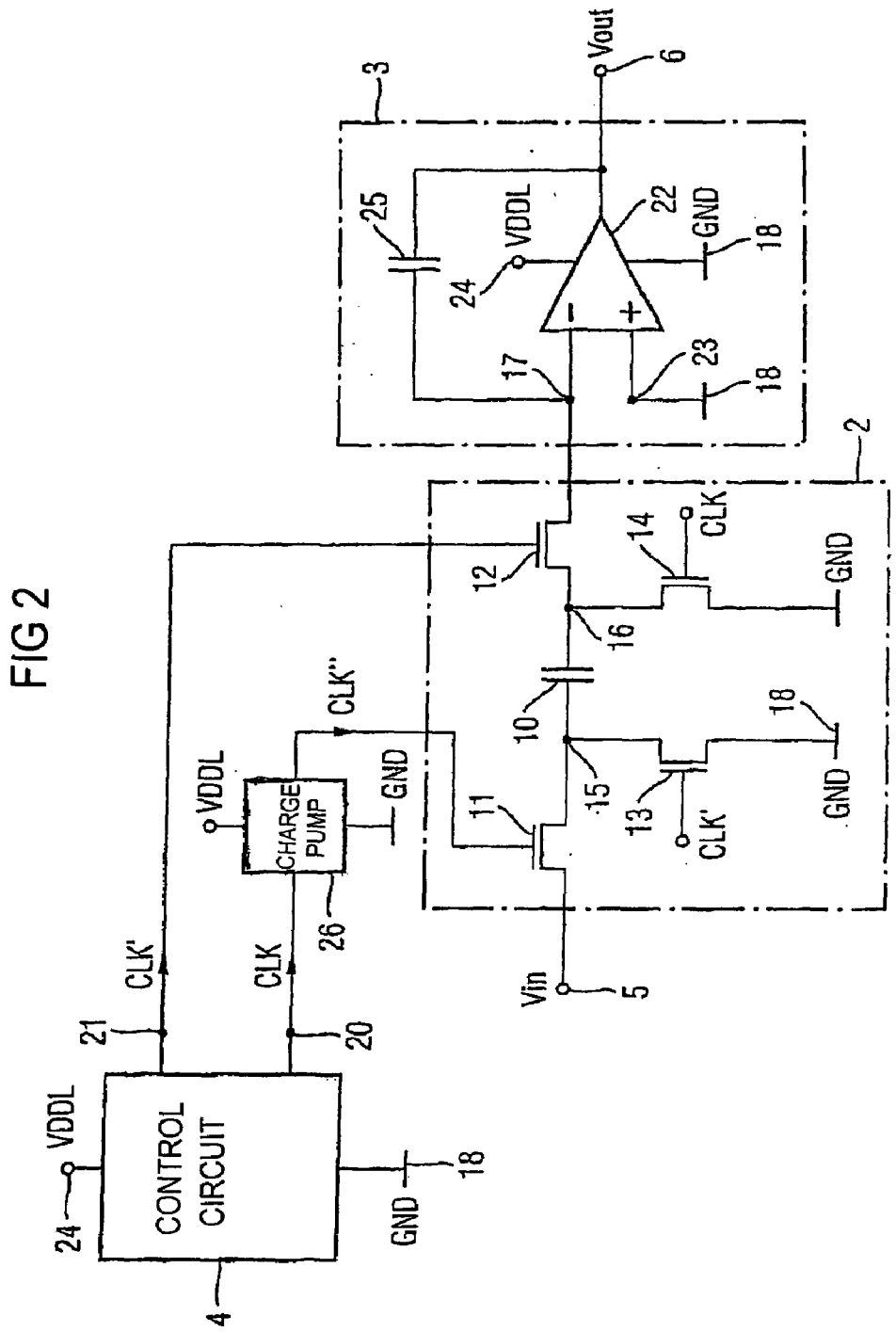
FIG. 2 shows a block diagram of a second exemplary embodiment of an SC circuit arrangement based on the invention.

FIG. 2 uses a block diagram to show a second exemplary embodiment of an SC circuit arrangement based on the invention.

Unlike the exemplary embodiment in FIG. 1, the control circuit 4 in the circuit example in FIG. 2 is no longer supplied by the high supply potential VDDH, but rather, in line with the other circuit parts in the SC circuit arrangement 1, is likewise supplied by the low supply potential VDDL. The output of the control circuit 4 thus produces clock signals CLK, CLK' which have a correspondingly lower amplitude than the clock signals CLK, CLK' in FIG. 1. In this regard, see also the signal/time diagrams in FIG. 3, which shows the clock signals CLK, CLK', CLK" in FIG. 2.

So that the switched capacitor circuit 2 now also has the required linearity, however, the input transistor 11 is in the form of a thick oxide transistor. The other transistors 12-14 are conventional transistors produced using deep submicron technology. As already mentioned above, the input transistor 11 requires control potentials which have a higher amplitude than is provided by the clock signal CLK provided by the control circuit 4. Hence, the control circuit 4 contains a charging device 26, for example a charge pump. This charge pump 26, whose supply side is likewise arranged between the first and third supply connections 18, 24, has the clock signal CLK supplied to it. From this, the charge pump 26 produces a clock signal CLK" which, in comparison with the clock signal CLK supplied at the input, has an amplitude which is increased in line with the higher supply potential VDDH (see FIG. 3). This clock signal CLK" provided by the charge pump 26 is now large enough or now has the appropriate amplitude to actuate the thick oxide transistor 11 such that the SC circuit arrangement has the required linearity.

Unlike the input transistor 11, the other transistors 12-14 in the switched capacitor circuit 2 may also be in the form of conventional transistors produced using deep submicron technology. In the case of the output transistor 12, this is possible because the node 17 is approximately at the potential of reference ground GND following a charge reversal operation in the capacitor 10. The output transistor 12 thus has no voltage drop correlated to the input signal Vin across it, which means that virtually no distortions to the input signal Vin which could influence the linearity arise in this case. The same applies to the transistors 13, 14, which have the potential of reference ground GND applied to them anyway and thus contribute only very little to any distortion of the input signal Vin.

The particular advantage of the circuit variant in FIG. 2 is that in this case not only the output stage 3 but also the clock generator 4 can be produced using deep submicron technology. The corresponding transistors in the clock generator 4 or in the output stage 3 can thus likewise be produced using CMOS technology, which means that they are now also supplied with a correspondingly lower supply voltage VDDL-GND. The result is thus also a lower power loss, which is known to be proportional to the square of the supply voltage.

Although the present invention has been described above with reference to a preferred exemplary embodiment, it is not limited thereto but rather may be extended as desired.

Thus, the invention is not necessarily limited to SC filter arrangements, but rather may naturally also be extended to other circuit arrangement using switched capacitor topology. By way of example, it would also be conceivable to implement an SC subtractor.

In the exemplary embodiments above, it is naturally possible to specify a multiplicity of different circuit variants by interchanging the conductivity types and transistor types. The invention is also not limited to the numerical examples indicated, which have been indicated merely for the sake of better clarity. In the present exemplary embodiment, the SC circuit arrangement has been shown with a single switched capacitor stage. It goes without saying that it is additionally or alternatively possible to connect a plurality of these SC circuit arrangements in series with one another or in parallel with one another too in this case.

LIST OF REFERENCE SYMBOLS

1 SC circuit arrangement
2 Switched capacitor circuit
3 Output stage
4 Control circuit, clock generator
5 Input
6 Output
10 Capacitive element, capacitor
11 Controllable switch, input transistor
12 Controllable switch, output transistor
13 Controllable switch, transistor
14 Controllable switch, transistor
15 Electrode, node
16 Electrode, node
17 First input
18 First supply connection
19 Second supply connection
20 Output
21 Output
22 Amplifier
23 Second input
24 Third supply connection
25 Integrating coupling capacitance
26 Charging device, charge pump
C1, C2 Capacitances
CLK, CLK', CLK" Clock signals
GND (First) supply potential, potential of reference ground
I1 Integration current
VDDH (Second, positive) supply potential
VDDL (Third, positive) supply potential
Vin Input signal
Vout output signal

The invention claimed is:

1. A linear SC circuit arrangement using integrated deep submicron technology, the circuit arrangement comprising:
at least one switched capacitor circuit including an input, an output, at least one switchable capacitor and at least one first transistor, wherein the input is operable to receive an input signal;
a control circuit operable to actuate the at least one first transistor; and
an output stage connected to the output of the at least one switched capacitor circuit, the output stage comprising at least one second transistor;
wherein the at least one first transistor is at least one thick oxide transistor and the at least one first transistor has a higher withstand voltage than the at least one second transistor;
the at least one first transistor comprises a plurality of first transistors; and
the plurality of first transistors comprises at least one transistor arranged between the input of the at least one switched capacitor circuit and a first electrode of the at least one switchable capacitor, wherein the plurality of first transistors further comprise at least one additional transistor arranged between a second electrode of the switchable capacitor and the output of the at least one switched capacitor circuit, and wherein the at least one transistor and the at least one additional transistor are each operable to be actuated by a clock signal clocked in antiphase.

2. The circuit arrangement of claim 1 wherein the at least one first transistor comprises at least one first gate dielectric and the at least one second transistor comprises at least one second gate dielectric, wherein the thickness of the at least one first gate dielectric is at least 1.5 times greater than the thickness of the at least one second gate dielectric.

3. The circuit arrangement of claim 2 wherein the thickness of the at least one first gate dielectric is at least twice the thickness of the at least one second gate dielectric.

4. The circuit arrangement of claim 1 wherein the control circuit comprises a clock generator, the clock generator operable to output at least one clock signal, and the at least one clock signal operable to actuate the at least one first transistor.

5. The circuit arrangement of claim 4 wherein the at least one first transistor comprises a plurality of first transistors, and wherein a first set of the plurality of first transistors are actuated by the clock signal and a second set of the plurality of first transistors are actuated by a signal in antiphase with the clock signal.

6. The circuit arrangement of claim 1 wherein the plurality of first transistors have a withstand voltage that is substantially the same as a third transistor provided in an I/O interface on the circuit arrangement.

7. The circuit arrangement of claim 1 wherein the the at least one transistor having a first withstand voltage, and wherein the at least one additional transistor has have a lower withstand voltage than the first withstand voltage, and wherein the at least one additional transistor has the same withstand voltage as the at least one second transistor.

8. The circuit arrangement of claim 7 wherein the control circuit is operable to produce a first control signal, the first control signal a low signal level operable to actuate the remaining plurality of first transistors, and wherein the control circuit comprises a charge pump operable to convert the first control signal into a second control signal which has a higher signal level than the first control signal.

9. The circuit arrangement of claim 1 wherein the switched capacitor circuit comprises a switched capacitor filter.

10. The circuit arrangement of claim 1 wherein the at least one first transistor is a CMOS transistor.

11. The circuit arrangement of claim 1 wherein a dimensional measurement of the at least one second transistor is less than 0.25 μm.

12. A linear switched capacitor circuit arrangement using integrated deep submicron technology, the circuit arrangement comprising:
at least one switched capacitor circuit including at least one switchable capacitor and a plurality of first transistors, the plurality of first transistors comprising at least one thick oxide transistor;
an output stage connected to the switched capacitor circuit, the output stage comprising at least one second transistor, wherein the at least one thick oxide transistor has a higher withstand voltage than the at least one second transistor;
a control circuit operable to output at least one control signal to the at least one switched capacitor circuit, wherein the at least one control signal is operable to actuate the at least one thick oxide transistor, wherein a first supply potential and a second supply potential connected to the control circuit in order to produce the at least one control signal;
wherein the first supply potential and a third supply potential are connected to the output stage; and
wherein the at least one control signal is a clock signal, and the plurality of first transistors comprise a first set of transistors and a second set of transistors, wherein the first set of transistors are actuated by the clock signal and the second set of transistors are actuated by the clock signal in antiphase.

13. The circuit arrangement of claim 12 wherein the second supply potential is greater than the third supply potential.

14. The circuit arrangement of claim 12 wherein the second supply potential is equal to the third supply potential and further comprising a charge pump connected between the control circuit and the at least one switched capacitor circuit, the charge pump operable to increase the amplitude of the at least one control signal based on a fourth supply potential connected to the charge pump.

15. The circuit arrangement of claim 12 wherein the third supply potential is lower than two volts.

16. A linear SC circuit arrangement using integrated deep submicron technology, the circuit arrangement comprising:
at least one switched capacitor circuit including an input, an output, at least one switchable capacitor and at least one first transistor, wherein the input is operable to receive an input signal;
a control circuit operable to actuate the at least one first transistor; and
an output stage connected to the output of the at least one switched capacitor circuit, the output stage comprising at least one second transistor;
wherein the at least one first transistor is at least one thick oxide transistor and the at least one first transistor has a higher withstand voltage than the at least one second transistor; and
the at least one first transistor is arranged between the input of the at least one switched capacitor circuit and a first electrode of the at least one switchable capacitor, wherein the at least one switched capacitor circuit further comprises at least one additional transistor arranged between a second electrode of the switchable capacitor and the output of the at least one switched capacitor circuit, and wherein the at least one first transistor and the at least one additional transistor are each operable to be actuated by a clock signal clocked in antiphase.

17. A linear SC circuit arrangement using integrated deep submicron technology, the circuit arrangement comprising:
at least one switched capacitor circuit including an input, an output, at least one switchable capacitor and a first and second transistor, wherein the input is operable to receive an input signal;
a control circuit operable to actuate the first and second transistors; and
an output stage connected to the output of the at least one switched capacitor circuit, the output stage comprising at least a third transistor;
wherein the first transistor comprises at least one thick oxide transistor having a higher withstand voltage than the second and third transistors.

* * * * *